United States Patent [19]

Strack

[11] Patent Number: 4,612,448

[45] Date of Patent: Sep. 16, 1986

[54] ELECTRONIC SWITCH

[75] Inventor: Helmut Strack, Munich, Fed. Rep. of Germany

[73] Assignee: Siemens Aktiengesellschaft, Berlin and Munich, Fed. Rep. of Germany

[21] Appl. No.: 698,000

[22] Filed: Feb. 4, 1985

[30] Foreign Application Priority Data

Apr. 11, 1984 [DE] Fed. Rep. of Germany ....... 3413666

[51] Int. Cl.⁴ .............................................. H03K 17/72
[52] U.S. Cl. .................................. 307/252 G; 307/570
[58] Field of Search ............. 307/570, 257 A, 252 D, 307/252 G, 252 M, 252 J; 357/38, 38 G

[56] References Cited

U.S. PATENT DOCUMENTS 3,619,652 11/1971 Ogle .................................. 307/305

OTHER PUBLICATIONS

B. J. Baliga, "High Gain Power Switching Using Field Controlled Thyristors", Solid–State Electronics, vol. 25, No. 5, pp. 345-353, 1982.

Primary Examiner—John Zazworsky
Attorney, Agent, or Firm—John Francis Moran

[57] ABSTRACT

Connected in series with a thyristor (1) are two IG-FETs (2, 3) one to the anode side and the other to the cathode side. Between the inner thyristor zones (6, 8) and the outer IGFET connections, a threshold circuit (10, 11) is connected to each. The threshold voltage of the threshold circuit is higher than that of the p-n junctions between the outer and adjacent inner thyristor zones (6, 7; 8, 9) including the voltage drop of the conducting IGFET. The switch is turned off by operating to turn off the IGFETs. The current then flows via the threshold elements through the two inner zones (6, 8). The charge carriers of this diode are evacuated very quickly, since carrier injection from the outer zones is no longer possible.

4 Claims, 2 Drawing Figures

ELECTRONIC SWITCH

BACKGROUND OF THE INVENTION

The present invention relates to an electronic switch with a thyristor with four zones of alternating conductivity type, and, more particularly, it relates to an electronic switch having a first IGFET connected in series to the cathode terminal.

A conventional electronic switch of the relevant type is described in the journal "Solid State Electronics", volume 25, No. 5, pages 345 to 353, 1982, wherein FIG. 3 is the most relevant. This type of thyristor includes a specific field-controlled thyristor with a grounded gate electrode. For turnoff of the electronic switch, the IGFET is blocked. The current caused by charge carriers stored in the thyristor then flows through the gate electrode to ground. A disadvantage of this switch is that after turnoff of the IGFET charge carriers continue to flow from the anode-side emitter zone into the inner zones of the thyristor as long as the p-n junction between the anode-side emitter zone and the anode-side base zone is biased in the conducting direction. As a result, the quantity of charge carriers to be evacuated is increased. The clearing time is accordingly long and turnoff is delayed.

It is a primary object of the invention to provide an electronic switch of the foregoing type having a much faster turnoff than heretofore possible.

SUMMARY OF THE INVENTION

In an electric switch arrangement including a first IGFET connected in series according to the invention, a second IGFET is connected serially with a thyristor at its anode terminal. The second IGFET is connected between the outer anode-side zone and a second terminal of the switch. The first IGFET is connected between the outer cathode-side zone and a third terminal of the switch, the inner anode-side and the inner cathode-side zones are provided with a connection for each, while between the connection of the inner anode-side zone and the second terminal a first threshold circuit is connected. Between the connection of the inner cathode-side zone and the third terminal a second threshold circuit is connected, and the threshold circuits have a higher threshold voltage than the p-n junctions between the two anode-side and cathode-side zones including the forward resistance of the IGFETs connected with the outer anode-side and cathode-side zones.

In some of the additional aspects of the invention, each threshold circuit includes a shunt connected capacitor. Each threshold circuit further includes a plurality of serially connected diodes. A zener diode is also included in each threshold circuit and is connected to span the serially connected diodes.

BRIEF DESCRIPTION OF THE DRAWINGS

Further objects and additional features of the invention will become apparent upon reading the following detailed description in conjunction with the drawing wherein.

DETAILED DESCRIPTION

Figure 1:
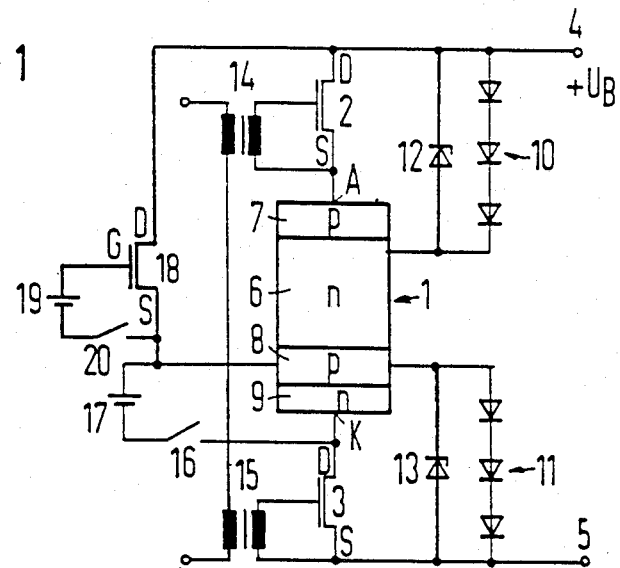
FIG. 1 is a first circuit arrangement embodying the inventive principles.

In FIG. 1 an electric switch includes a thyristor 1 with four zones of alternating conductivity types. It is to be assumed that starting from the cathode connection K to the anode connection A the zone sequence is npnp. Connected with the anode connection A is the source-drain path of a first IGFET 2. Connected with the cathode connection K is the source-drain path of a second IGFET 3. The remaining connections of the IGFETs 2 and 3 are applied to a first terminal 4 and a second terminal 5, respectively. With respect to these remaining terminals, the IGFETs are connected in series with the thyristor. The thyristor 1 comprises an inner anode-size zone 6, an outer anode-side zone 7, an inner cathode-side zone 8 and an outer cathode-side zone 9. The inner zones 6 and 8 are each provided with a connection. The gate connection at zone 8 is typical for conventional thyristors. The connection of zone 6 may be readily provided, for example, by a recess in zone 7. Between zone 6 and the first terminal 4 is a first threshold circuit 10. Between zone 8 and the second terminal 5 is a second threshold circuit 11. These threshold circuits have a threshold voltage which is higher than the threshold voltages of the p-n junctions between zones 6 and 7 and between 8 and 9 including the forward voltage of IGFETs 2 and 3, respectively. The threshold circuits 10, 11 may include, for example, a number of series-connected diodes and a Zener diode 12, 13 in each. The series diodes 10, 11 are connected to conduct in the forward direction with respect to an applied voltage $+U_B$. The Zener diodes 12, 13 are connected so that they breakdown by a voltage in the reverse direction.

When IGFETs 2, 3 are turned on, the thyristor is connected to the voltage $+U_B$. The IGFETs may be driven, for example, by transformers 14, 15. It is also possible to drive the IGFETs without a direct potential through an opto-coupler or a piezo-coupler, as illustrated for example in the journal "Siemens Components", 20 (1982) No. 1, pages 8 to 13, in particular FIG. 1. The thyristor 1 is fired by biasing the p-n junction between zones 8 and 9 in the forward conducting direction. This may occur, for example, by a voltage source 17 which is applied to zones 8 and 9 via a switch 16. Naturally other possibilities of firing the thyristor 1 may be employed as well. Thus, zone 8 may, for example, be connected via the source-drain path of an additional IGFET 18 with terminal 4. IGFET 18 is then controlled via a switch 20 by which the voltage of a voltage source 19 is applied to the gate electrode and source electrode.

When thyristor 1 is conducting, current flows from terminal 4 via the IGFET 2, through thyristor 1 and IGFET 3 to terminal 5. When the threshold circuits are not conducting, the voltage drop between terminal 4 and zone 6 or between zone 8 and terminal 5 is smaller than the threshold voltage of these threshold circuits.

When thyristor 1 is to be turned off, first IGFETs 2 and 3 are turned off by a corresponding signal. Thereby zones 7 and 9 are separated from the voltage $+U_B$. The threshold circuits 10 and 11 now carry current, and the charge carriers stored in zones 6 and 8 are evacuated directly by the voltage applied at the connections of these zones. Charge carriers cannot then be injected from zones 7 and 9 into zones 6 and 8, as the outer zones are disconnected from voltage. Thus only that quantity of charge carriers which needs to be evacuated from the thyristor is stored in zones 6 and 8 when the IGFETs 2 and 3 are turned off. Hence the number of stored charge carriers is only a small fraction of the charge carriers to be evacuated when turning off an ordinary thyristor. How large this fraction is depends on the ratio of the dopant concentrations between the zones 7, 6 and 9, 8, respectively.

Figure 2:
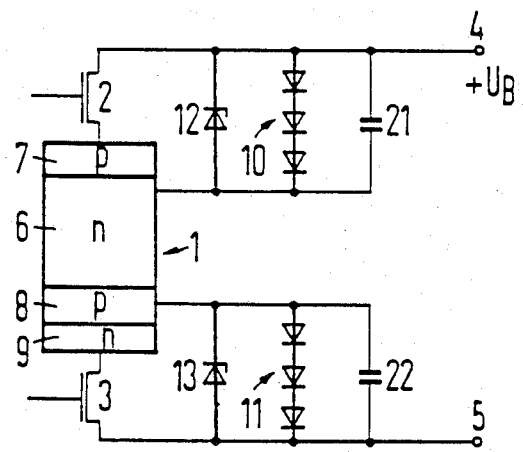
FIG. 2 is a second circuit arrangement in accordance with the invention.

In FIG. 2 the main difference is two additional capacitors 21 and 22, which are connected in parallel with the threshold circuits 10 and 11, respectively. When the electronic switch according to FIG. 2 is turned off, these capacitors are charged to the threshold voltage of the threshold circuits which respectively includes devices 10, 11 and 12, 13. If thyristor 1 is then to be fired again, it is able to turn on the two IGFETs 2 and 3. Then the discharge current of capacitor 21 flows into zone 6 and the discharge current of capacitor 22 to zone 8. Accordingly, the blocked p-n junction between zones 6 and 8 is biased in the conducting direction and the thyristor can fire. For driving the IGFETs 2 and 3 the same arrangement as that described for the electronic switch of FIG. 1 may be used. Here, however, a separate firing current source for thyristor 1 is not necessary.

It is to be understood that those skilled in the art may devise numerous and varied other changes to the illustrative embodiments herein described. Accordingly, such changes are within the scope of the invention, which is only limited by the following claims.

What is claimed is:

1. An electronic switch of the thyristor type having four zones of alternating conductivity types and a first IGFET is connected in series, the electric switch comprising:
   (a) a second IGFET being connected in series with the thyristor at its anode terminal,
   (b) the second IGFET being connected across an outer anode-side zone of the electronic switch and a second terminal of the electronic switch,
   (c) the first IGFET being connected across an outer cathode-side zone of the electronic switch and a third terminal of the electronic switch,
   (d) an inner anode-side and an inner cathode-side zones being provided with a separate connection for each,
   (e) a first threshold circuit being connected between the connection of the inner anode-side zone and the second terminal
   (f) a second threshold circuit being connected between the connection of the inner cathode-side zone and the third terminal and
   (g) the first and second threshold circuits having a higher threshold voltage than the p-n junctions between the two anode-side and the cathode-side zones including the forward resistance of the first and second IGFETs connected with the outer anode-side and cathode-side zones.

2. An electronic switch according to claim 1, further comprising a capacitor being connected in parallel within each threshold circuit.

3. An electronic switch according to claim 1, wherein each of said first and second threshold circuits comprises diodes being serially connected.

4. An electronic switch according to claim 1, wherein each threshold circuit further includes a Zener diode.

* * * * *